United States Patent [19]

Matthews

[11] Patent Number: 4,713,630
[45] Date of Patent: Dec. 15, 1987

[54] BPSK COSTAS-TYPE PLL CIRCUIT HAVING FALSE LOCK PREVENTION

[75] Inventor: David Matthews, Mount Airy, Md.

[73] Assignee: Communications Satellite Corporation

[21] Appl. No.: 890,231

[22] Filed: Jul. 29, 1986

[51] Int. Cl.[4] .................. H03L 7/12; H04L 27/22
[52] U.S. Cl. .................. 331/4; 331/DIG. 2; 329/50; 329/124; 375/81; 375/120
[58] Field of Search .................. 329/50, 122, 124; 331/4, DIG. 2; 375/81, 83–87, 120

[56] References Cited

U.S. PATENT DOCUMENTS

| | | | |
|---|---|---|---|
| 4,213,096 | 7/1980 | Daniel, Jr. ................ | 331/4 X |
| 4,241,454 | 12/1980 | Snell et al. ................ | 329/50 X |
| 4,297,650 | 10/1981 | Shinmyo ................ | 329/124 X |
| 4,314,206 | 2/1982 | Attwood et al. ................ | 329/124 X |
| 4,507,617 | 3/1985 | Sasaki ................ | 329/124 X |
| 4,547,736 | 10/1985 | Takeda ................ | 331/25 X |

Primary Examiner—Siegfried H. Grimm
Attorney, Agent, or Firm—Sughrue, Mion, Zinn, Macpeak & Seas

[57] ABSTRACT

A BPSK Costas-type PLL circuit in which the circuit is positively prevented from falsely locking on to the input signal and in which the need for a complex lock detector is eliminated. The output levels of both the 0° and 90° sub-loops of the circuit are detected and a difference formed between the detected outputs. When the difference exceeds a predetermined reference level, it is determined that true locking has occurred, whereupon a sweep generator, used in achieving initial lock, is decoupled from the PLL circuit.

7 Claims, 2 Drawing Figures

BPSK COSTAS-TYPE PLL CIRCUIT HAVING FALSE LOCK PREVENTION

BACKGROUND OF THE INVENTION

The present invention relates to a BPSK (Binary Phase-Shift Keying) Costas-type PLL (Phase-Locked Loop) circuit in which false locking, and consequently a high bit error rate, is prevented.

FIG. 1 of the accompanying drawings depicts a BPSK Costas-type PLL circuit of a configuration that has been widely used in the prior art. A BPSK modulated signal at IF (Intermediate Frequency) received on a line 10 is split into two parts, which are applied to first inputs of respective balanced mixers 11 and 12. The mixers 11 and 12 may be implemented, for instance, as double-balanced diode mixers. Second inputs of the mixers 11 and 12 receive as reference signals to the respective mixers 90° and 0° outputs from a voltage-controlled oscillator 14. The outputs of the mixers 11 and 12 are applied through respective data low-pass filters 13 and 16 and thence through amplifiers 17 and 21. The output of the amplifier 17 in the 90° leg is applied directly to one input of a multiplier 22, while the other is passed through a limiter 21 before being applied to the other input of the multiplier 22. The data output of the circuit is also provided by the output of the limiter 21. The output of the multiplier is applied through a loop filter 15 to the voltage control input of the voltage-controlled oscillator 14. A sweep generator 23 is connected through a switch 24, which may be an FET (Field-Effect Transistor) switch, to the junction between the loop filter 15 and the voltage-controlled oscillator 14.

In operation, demodulation of the input BPSK signal to baseband is accomplished in the mixers 11 and 12 by mixing the BPSK signal with the 0° and 90° output signals from the voltage-controlled oscillator. These 0° and 90° signals are coherent recovered signals at the IF frequency. The mixer 12 driven by the 0° signal outputs bipolar data, which is passed through the low-pass filter 16 to remove higher-order mixing products and the normally present channel noise. The bandwidth of the filter 16 should be about the same as the symbol rate of the data to be recovered. On the other hand, the mixer 11 driven by the 90° signal outputs a signal that contains a data signal component which is proportional to the amount of phase error between the IF signal and the coherent recovered carrier. This error signal is passed through the filter 13, which is identical to the filter 16 in the 0° arm of the circuit. After passing through the limiter 21 (which is provided to allow a less critical design of the multiplier circuits), this signal is multiplied with the error signal provided on the output of the amplifier 17 by the multiplier 22. The resulting product signal, which has an amplitude proportional to the phase error and a polarity corresponding to the direction of the phase error (positive or negative), drives the loop filter 15, thereby to establish the phase-locked loop bandwidth. The output of the loop filter 15 controls the frequency of the 0° and 90° signals produced by the voltage-controlled oscillator 14.

When the circuit is put into operation, due to its narrow bandwidth, it is necessary to achieve initial phase lock with the input BPSK signal. For this purpose, the switch 24 is closed and the sweep generator 23 swept in frequency until locking is detected. At that time, the switch 24 is opened, allowing the circuit to operate in the manner described above.

However, sometimes false locking of the circuit may occur. This happens especially when the received signal has a frequency error of the same order as the symbol rate of the data it carries.

More specifically, during the initial lock-in procedure, the frequency of the sweep generator 23 is swept through the expected range of uncertainty of the input signal to cause the narrow bandwidth PLL circuit to lock itself on to the input signal. If though the combined IF error and voltage-controlled oscillator offset due to the sweep are equal to the symbol rate, false locking will occur. In such a condition, the bit error rate of the data signal on the output of the limiter 21 will be very high, even though there is little or no channel noise present. This is a distinct drawback with this circuit.

Another drawback is that there must be some further circuitry (not shown in FIG. 1 but of well-known design) provided to detect when lock-in occurs, which circuitry is unavoidably complex.

SUMMARY OF THE INVENTION

Accordingly, it is an object of the present invention to provide a Costas-type PLL circuit of the same general type described above in which false locking of the circuit with the input signal is prevented.

In accordance with the above and other objects and the inventive concept, there is provided a BPSK Costas-type loop circuit having 0° and 90° sub-loops, and a sweep generator for initially locking the two sub-loops on to an input BPSK signal, as in the case of the conventional Costas-type PLL circuit discussed above. Further, however, detectors are provided to detect the signal levels at the output nodes of each of the two sub-loops. A difference is sensed between the two detected signal levels. When the difference exceeds a predetermined reference level, the sweep generator is decoupled from the sub-loops to allow then to conduct their normal operation with the circuit properly locked on to the input signal. However, when the difference is below the reference level, the sweep generator is maintained coupled to the sub-loops to prevent false locking.

It is a further object of the invention to provide a simplified circuit design by eliminating the need for a complex circuit for detecting lock-in.

DESCRIPTION OF THE PREFERRED EMBODIMENTS

Figure 2:
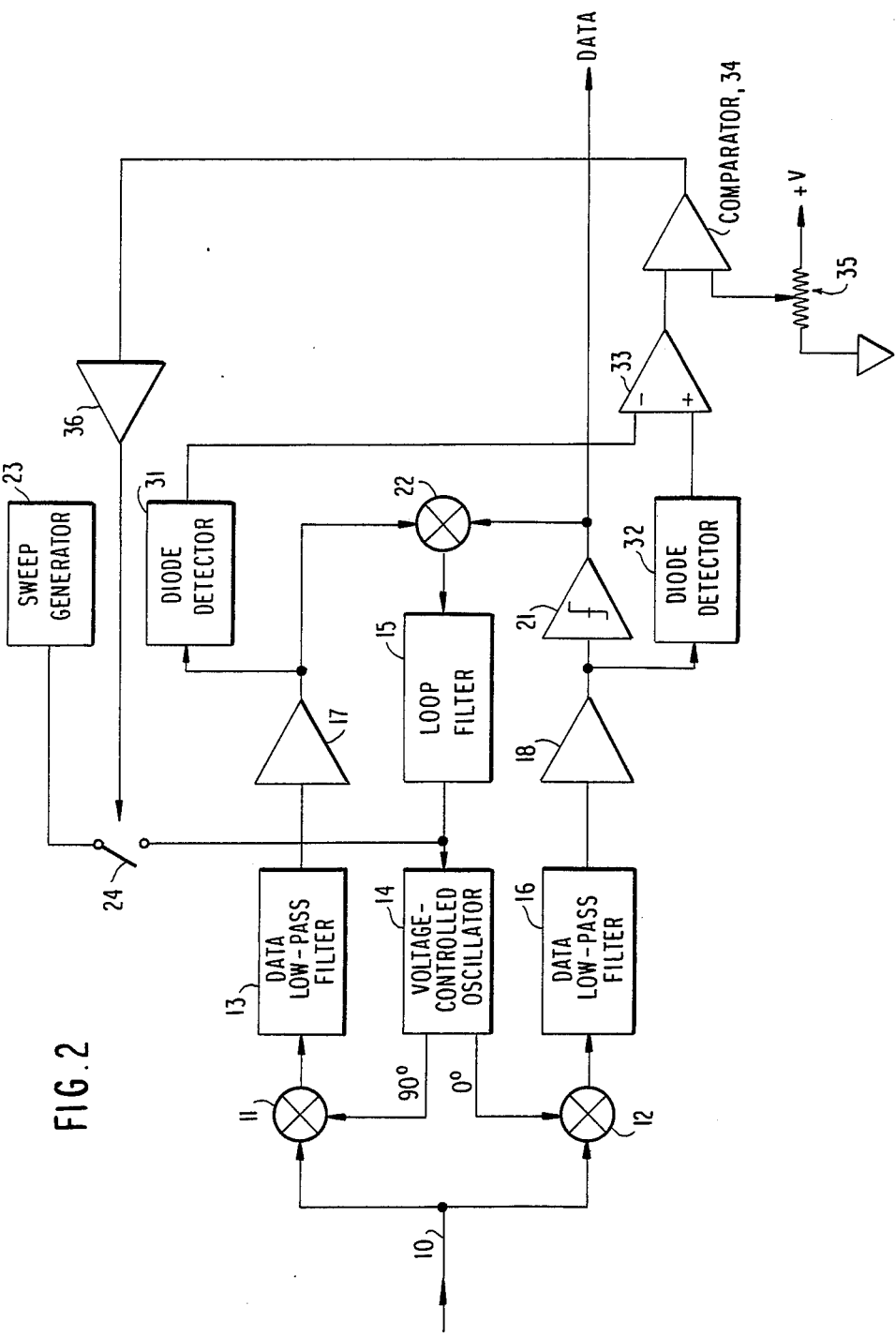
FIG. 2 is a schematic diagram of a BPSK Costas-type PLL circuit constructed in accordance with the invention.

Referring now to FIG. 2 of the accompanying drawings, a BPSK Costas-type PLL circuit constructed in accordance with the teachings of the present invention will be described.

Figure 1:
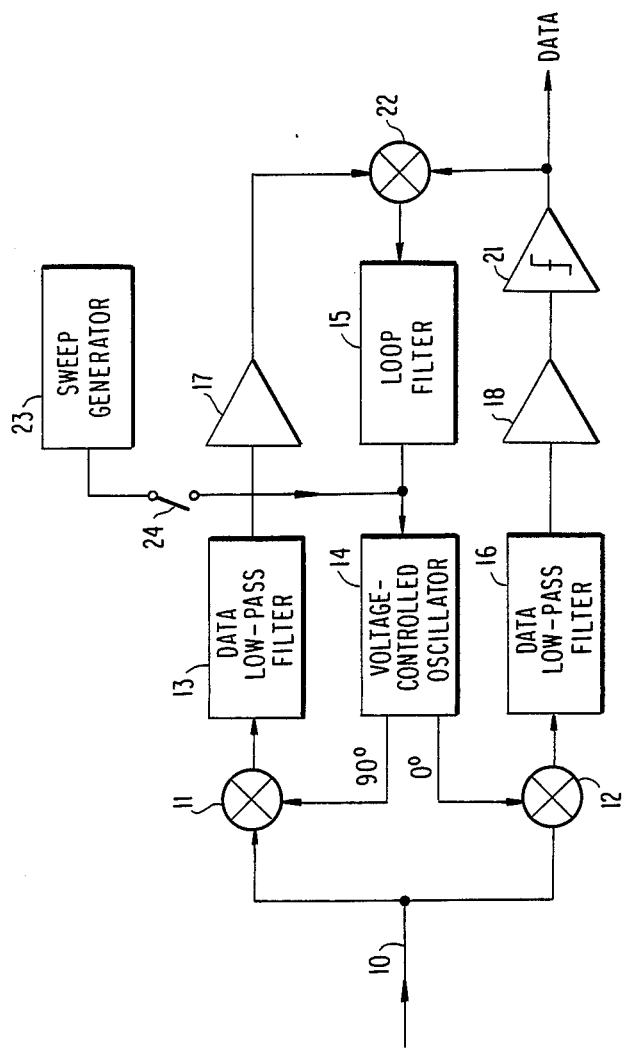
FIG. 1 is a schematic diagram of conventional BPSK Costas-type PLL circuit.

In FIG. 2, reference numerals seen commonly in FIG. 1 denote like elements, and hence a further detailed description thereof will be omitted.

In accordance with the instant invention, added to the circuit of FIG. 1 are diode detectors 31 and 32 having inputs coupled to the outputs of the amplifiers 17 and 18, respectively. The outputs of the detectors 31 and 32 are applied to respective noninverting and inverting inputs of a differential amplifier 33, the output of which is in turn connected to one input of a voltage comparator 34. The reference input of the voltage comparator receives a voltage set by a potentiometer 35. The output of the voltage comparator 34 is applied through an amplifier 36 to control the position of the switch 24.

In operation, if false lock-in occurs, the AC signal levels at the outputs of the amplifiers 17 and 18 will both be relatively high, and hence the outputs from the diode detectors 31 and 32 will both be high. In this case, by proper setting of the reference voltage applied to the voltage comparator 34, the switch is held closed, thereby causing the search for lock-in to continue. That is, false lock-in is prevented. On the other hand, when true lock-in occurs, only the AC output from the amplifier 17 in the 0° arm of the circuit will be relatively high, and hence the outputs from the diode detectors 31 and 32 will be high and low, respectively. In this case, the output of the voltage comparator changes states, opening the switch 24 and thereby leaving the loop properly locked on to the input signal.

Accordingly, with the circuit of the present invention, false lock-in during initial acquisition is positively prevented and, moreover, no complex circuit for detecting lock-in is required.

This completes the description of the preferred embodiment of the invention. However, although a preferred embodiment has been described, it is believed that numerous modifications and alterations thereto would be apparent to one of ordinary skill in the art without departing from the spirit and scope of the invention.

What is claimed is:

1. A BPSK Costas-type PLL circuit in which false lock-in is prevented by distinguishing between true lock-in and false lock-in, comprising:
   0° and 90° sub-loops, said 0° sub-loop comprising a first mixer receiving on a first input a BPSK IF signal, a first low-pass filter and amplifier coupled in series with one another and receiving as an input an output of said first mixer, a multiplier receiving on a first input an output of said first low-pass filter and amplifier, a loop filter having an input coupled to an output of said multiplier, and a voltage-controlled oscillator receiving as a control-voltage input an output of said loop filter, a 0° output of said voltage-controlled oscillator being coupled to a second input of said first mixer, and said 90° sub-loop comprising a second mixer receiving on a first input said BPSK IF signal, a second low-pass filter and amplifier coupled in series with one another and receiving as an input an output of said second mixer, said multiplier receiving on a second input an output of said second low-pass filter and amplifier, said 90° sub-loop including said loop filter and said voltage-controlled oscillator, A 90° output of .said voltage-controlled oscillator being coupled to a second input of said second mixer;
   sweep generator means coupled to said voltage-controlled oscillator for locking said 0° and 90° sub-loops on to said BPSK IF signal;
   means for detecting a difference in AC signal levels in said 0° and 90° sub-loops; and
   means for on/off controlling said sweep generator means in response to an output of said difference detecting means.

2. The BPSK Costas-type PLL circuit of claim 1, wherein said on/off controlling means turns off said sweep generator means when said difference is larger than a predetermined level and on when said difference is smaller than said predetermined level.

3. The BPSK Costas-type PLL circuit of claim 2, wherein said difference detecting means comprises first and second AC signal level detecting means having inputs coupled to outputs of said 0° and 90° loops, respectively, differential amplifier means receiving on respective differential inputs outputs of said first and second signal level detecting means, means for comparing an output of said differential amplifier means with a reference level, and means for switchably connecting and disconnecting said sweep generator means from said 0° and 90° sub-loops in response to an output of said comparing means.

4. A BPSK Costas-type PLL circuit comprising:
   first and second balanced mixers receiving on first inputs thereof an input BPSK signal;
   first and second low-pass filters having inputs coupled to outputs of said first and second balanced mixers, respectively;
   first and second amplifiers having inputs coupled to outputs of said first and second low-pass filters, respectively;
   a multiplier having inputs coupled to outputs of said first and second amplifiers;
   a loop filter having an input coupled to an output of said multiplier;
   a voltage-controlled oscillator having a frequency control input coupled to an output of said loop filter and 0° and 90° outputs coupled, respectively, to second inputs of said first and second balanced mixers;
   a sweep generator;
   an electronic switch for coupling an output of said sweep generator to said input of said voltage-controlled oscillator;
   first and second diode detectors having inputs coupled to said outputs of said first and second amplifiers, respectively;
   a differential amplifier having opposite polarity inputs coupled to outputs of said first and second diode detectors, respectively;
   means for providing a reference voltage; and
   a comparator receiving an output of said differential amplifier on a first input and said reference voltage on a second input, an output of said comparator being applied to control said electronic switch.

5. The BPSK Costas-type PLL circuit of claim 4, wherein a cutoff frequency of said first and second low-pass filters is set to approximately a data rate of said input signal.

6. The BPSK Costas-type PLL circuit of claim 5, further comprising a limiter disposed between said first amplifier and said multiplier.

7. The BPSK Costas-type PLL circuit of claim 6, further comprising a third amplifier having an input coupled to said output of said comparator and an output coupled to a control input of said electronic switch.

* * * * *